United States Patent
Chen

(10) Patent No.: US 6,780,737 B2
(45) Date of Patent: *Aug. 24, 2004

(54) METHOD OF MANUFACTURING SEMICONDUCTOR DEVICE WITH BURIED CONDUCTIVE LINES

(75) Inventor: Chao-Yang Chen, Feng-Shan (TW)

(73) Assignee: Macronix International Co., Ltd., Taiwan (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/322,654

(22) Filed: Dec. 19, 2002

(65) Prior Publication Data

US 2004/0121575 A1 Jun. 24, 2004

(51) Int. Cl.[7] ............................................. H01L 21/425
(52) U.S. Cl. ...................................... 438/525; 438/974

(58) Field of Search ................................. 438/525, 257, 438/259

(56) References Cited

U.S. PATENT DOCUMENTS

| | | | | |
|---|---|---|---|---|
| 6,611,037 B1 | * | 8/2003 | Rhodes | 257/466 |
| 6,620,698 B1 | * | 9/2003 | Chen et al. | 438/311 |
| 2002/0039821 A1 | * | 4/2002 | Wolstenholme | 438/257 |

* cited by examiner

Primary Examiner—W. David Coleman

(57) ABSTRACT

A method of manufacturing semiconductor devices with buried conductive lines is disclosed. The method uses an ion implantation process to form buried conductive lines under isolation regions such as shallow trench isolations. The buried conductive lines connect neighboring active regions and replace conventional contacts and lead lines connecting the active regions.

20 Claims, 6 Drawing Sheets

METHOD OF MANUFACTURING SEMICONDUCTOR DEVICE WITH BURIED CONDUCTIVE LINES

BACKGROUND OF THE INVENTION

1. Field of the Invention

The present invention relates to a method of manufacturing semiconductor devices, and more particularly to a method of manufacturing semiconductor devices with buried conductive lines.

2. Description of the Related Art

Modern semiconductor devices are designed and fabricated toward a trend of size minimization so that more and more devices can be packed in a chip with a limited area. In order to shrink the device sizes of these semiconductor devices and pack these semiconductor devices into one chip as more as possible, various conventional processes of fabricating these semiconductor devices have been improved or even replaced with new processes to overcome many nature limits. Semiconductor devices such as logic devices and memory devices particularly have the necessaries of size decrease and integration increase so that they can operate more powerfully and store more data.

As the density of these semiconductor devices continually increases, the multilevel interconnect structures of these semiconductor devices also have more and more levels. Meanwhile, the problems of the process window decrease and the reducing of planarization are also raised. FIG. 1 shows a cross-sectional diagram of conventional dynamic random access memory (DRAM) devices whose capacitors are not shown. A substrate 100, gate electrodes 102a and 102b, dielectric layers or interlevel dielectric (ILD) layers 104 and 108, a contact 106, a bit line 107, contacts 110a and 110b, and metal lead lines 112a and 112b are also shown in FIG. 1. The contact 106 and the bit line 107 as well as the contacts 110a and 110b, and the metal lead lines 112a and 112b are limits of integration increase and render the planarization of this integrated circuit degrading.

In view of the drawbacks mentioned with the prior art process, there is a continued need to develop new and improved processes that overcome the disadvantages associated with prior art processes. The requirements of this invention are that it solves the problems mentioned above.

SUMMARY OF THE INVENTION

It is therefore an object of the invention to provide a simplified process of forming contacts and lead lines of semiconductor devices.

It is another object of this invention to increase the integration and the die density of semiconductor devices and decrease the overhead of the semiconductor devices.

It is a further object of this invention to improve planarization of semiconductor devices and increase process window of the semiconductor devices.

To achieve these objects, and in accordance with the purpose of the invention, the invention uses a method comprising: providing a substrate; forming a trench in said substrate to form a isolation region therein and define active regions; forming a patterned mask layer over said substrate to expose adjacent active regions; and implanting ions into said substrate with a tilt angle to form a buried conductive line therein connecting adjacent active regions.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 2A:
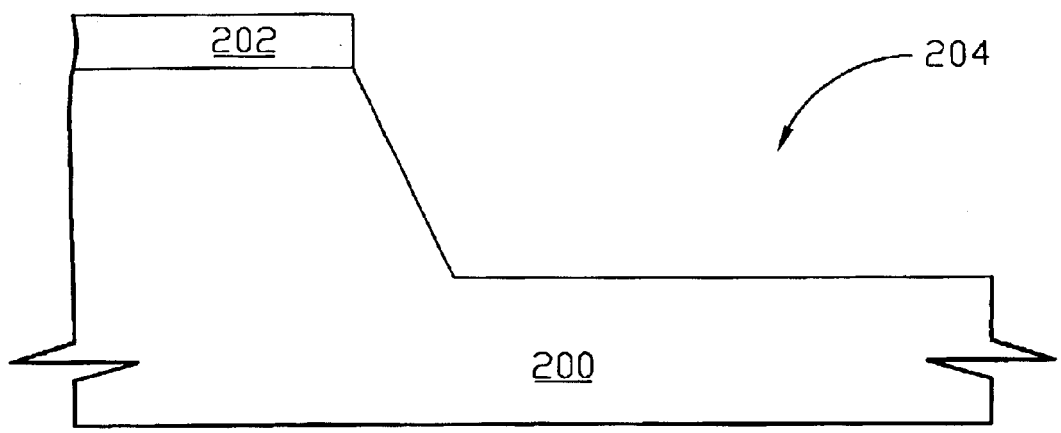
FIG. 2A shows a trench formed in a substrate.

Referring to FIG. 2A, a dielectric layer 202 is formed over a substrate 200, and the dielectric layer 202 and the substrate 200 are etched to form a trench 204 therein. The substrate 200 preferably comprises, but is not limited to, a silicon substrate with a <100> crystallographic orientation. The substrate can also comprise other semiconductor substrate such as a silicon on insulator (SOI)substrate, as well as other substrates comprise semiconductive materials such as diamond-like carbon, germanium, gallium arsenide and indium arsenide. The dielectric layer 202 preferably comprises, but is not limited to, a silicon nitride layer formed by chemical vapor deposition methods. The trench 204 is formed by etching methods such as dry etching, and is preferably formed by reactive ion etching. The trench 204 used to form isolation regions such as shallow trench isolations (STI) preferably has a depth of from about 3000 angstroms to about 4000 angstroms. Meanwhile, the region covered by the dielectric layer 202 is prepared to be used as the active region or the diffusion region of a semiconductor device. The semiconductor device comprises, but is not limited to, memory devices such as dynamic random access memory (DRAM) devices and flash memory devices as well as logic devices such as metal oxide semiconductor (MOS) devices. It is noted that FIG. 2A only shows a portion of the semiconductor devices, other portion of the semiconductor devices is omitted for simplicity.

Figure 2B:
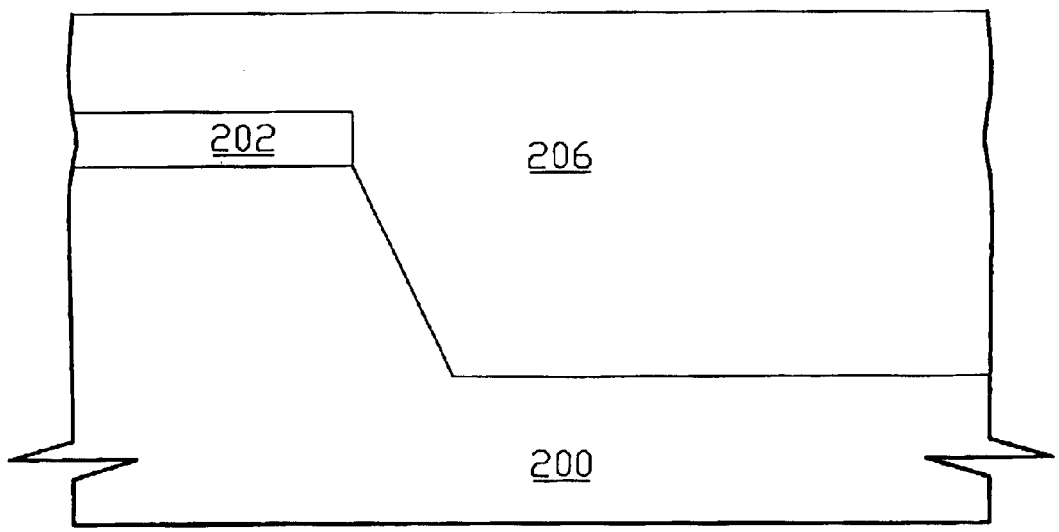
FIG. 2B shows a photoresist layer used as an implantation mask formed over the structure shown in FIG. 2A.
Figure 2C:
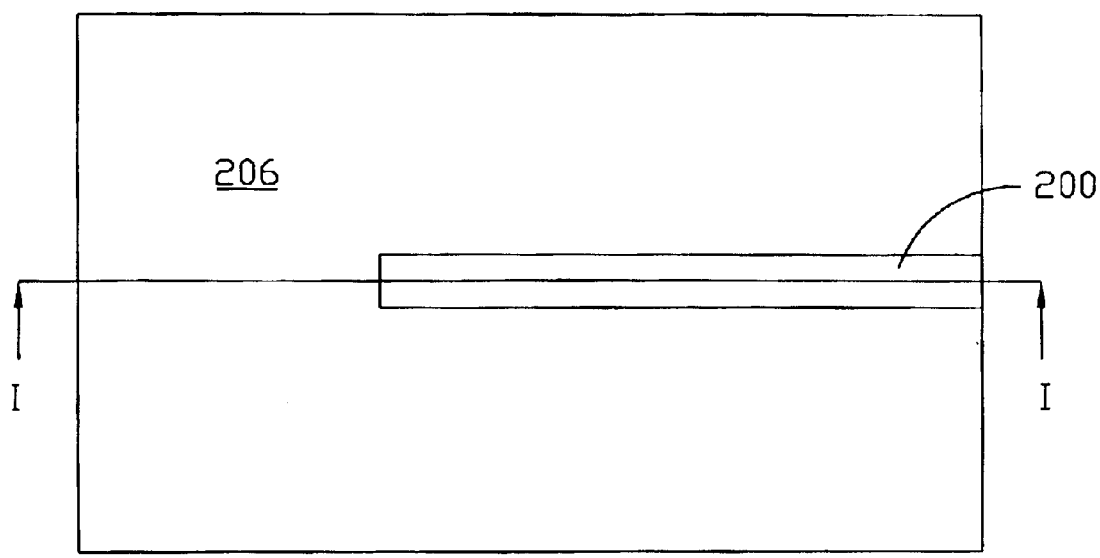
FIG. 2C shows the partial top view of the line pattern.

Referring to FIG. 2B, a photoresist layer 206 used as an implantation mask is formed over the structure shown in FIG. 2A. A line pattern is then transferred into the photoresist layer 206 to expose the substrate 200 by using photolithography processes. The line pattern connects adjacent active regions and is used to form buried conductive lines in the substrate 200. FIG. 2C shows the partial top view of the line pattern.

Figure 3A:
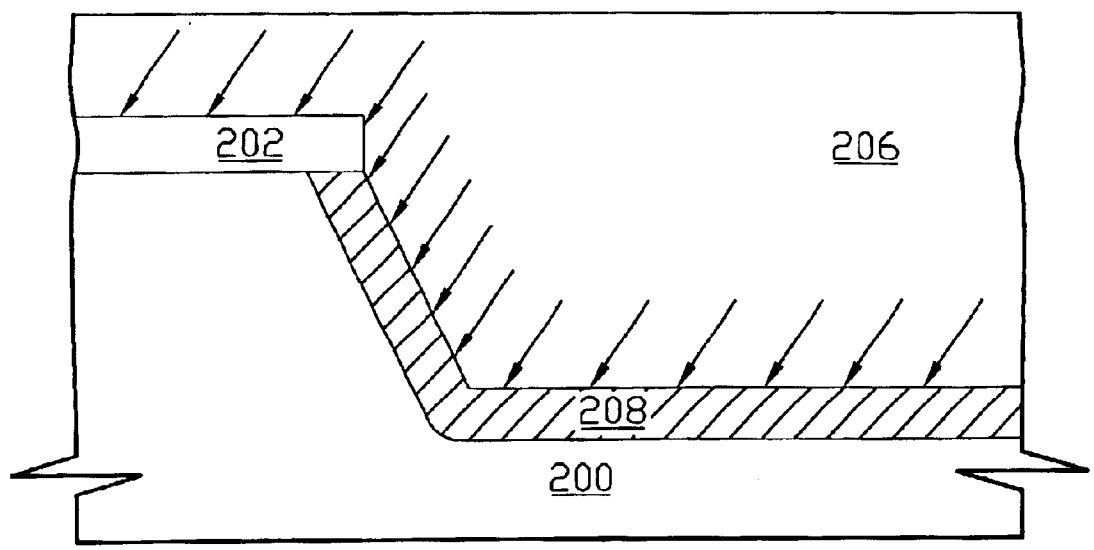
FIG. 3A shows a cross-sectional diagram of the semiconductor device taken along the line I—I shown in FIG. 2C.

FIG. 3A shows a cross-sectional diagram of the semiconductor device taken along the line I—I shown in FIG. 2C. The semiconductor device shown in FIG. 3A is implanted with doped ions to form a buried conductive line 208 in the substrate 200. The doped ions comprise, but are not limited to, n-type dopants such as arsenic ions and phosphorus ions. The type of doped ions implanted depends on demands of various semiconductor devices. For example, if the adjacent active regions connected by the buried conductive line 208 are p-type diffusion regions, the dopant ions should be p-type doped such as boron ions or $BF_2^+$. The doped ions are implanted into the substrate 200 with a tilt angle as shown in FIG. 3A. The implantation with a tilt angle is necessary for modern semiconductor devices having high integration. Because the active regions, particularly the diffusion regions, are formed with shallow depth to avoid the short channel effect resulting from the increase of the integration. The depth of the diffusion regions is from about 1500 angstroms to about 2500 angstroms. For semiconductor devices having diffusion regions with a deep depth, the tilt angle may not be necessary. For modern semiconductor devices having high integration, the tilt angle is from about 7 degrees to about 45 degrees and is preferably about 15 degrees. The dosage of the doped ions is from about $1\times10^{15}$ $cm^{-2}$ to about $3\times10^{15}$ $cm^{-2}$. The implantation energy is about 20 KeV to about 50 KeV. The thickness or the depth of the buried conductive line 208 is from about 1000 angstroms to about 2500 angstroms.

Figure 3B:
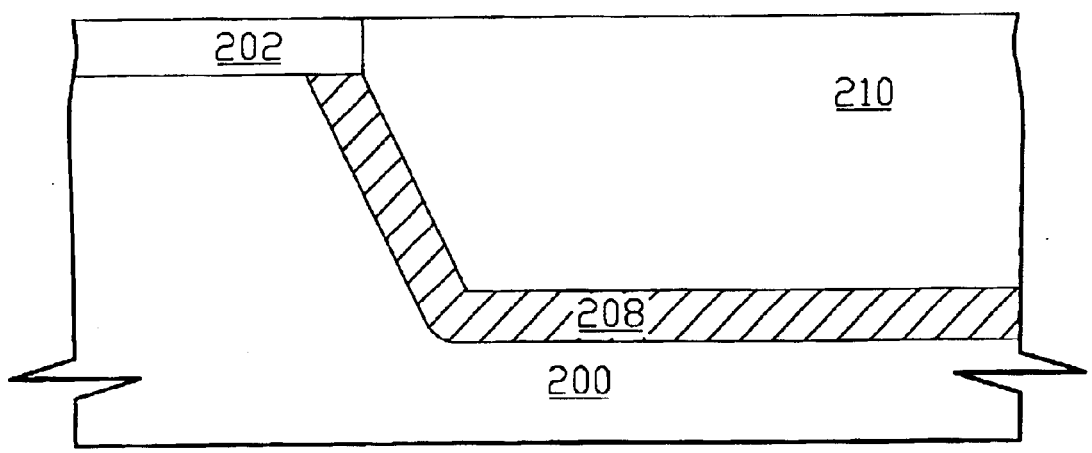
FIG. 3B shows a result of removing the photoresist layer shown in FIG. 3A and filling the trench.

Referring to FIG. 3B, the photoresist layer 206 is removed and the trench 204 is filled with a dielectric layer 210 by chemical vapor deposition processes and planarized by chemical mechanical polishing methods to form a shallow trench isolation. The dielectric layer 210 to preferably comprises, but is not limited to, a silicon dioxide layer. To maintain the conductivity of the buried conductive line 208, the chemical vapor deposition processes preferably comprise high density plasma (HDP) chemical vapor deposition (CVD) process. Chemical vapor deposition processes performed at a relative high temperature such as the low pressure chemical vapor deposition process should be avoided using.

Figure 3C:
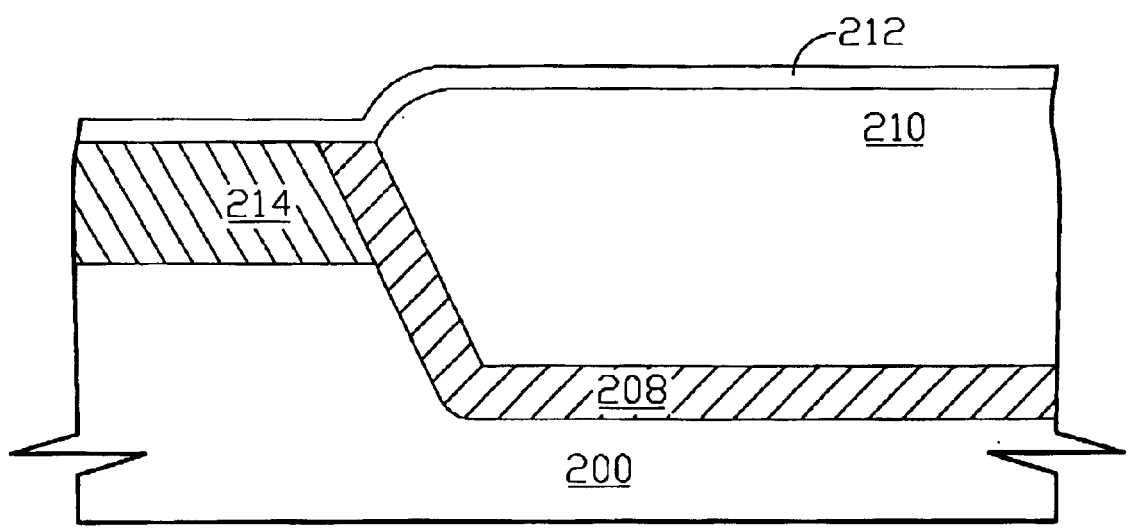
FIG. 3C shows a result of removing the dielectric layer shown in FIG. 3B and sequentially forming a sacrificial oxide layer and a diffusion region.

Referring to FIG. 3C, the dielectric layer 202 shown in FIG. 3B is removed and a sacrificial oxide layer 212 and a diffusion region 214 are sequentially formed. The structure shown in FIG. 3C is formed by the following steps. First, a corner rounding process is performed to round the corner of the shallow trench isolation. Then the dielectric layer 202 is removed by etching methods such as wet etching that uses a heated phosphorous acid solution as etchant or dry etching. Next, the sacrificial oxide layer 212 is formed over the substrate 200 by using oxidation methods such as wet thermal oxidation processes. The diffusion region 214 is then formed by using ion implantation processes.

Figure 1:
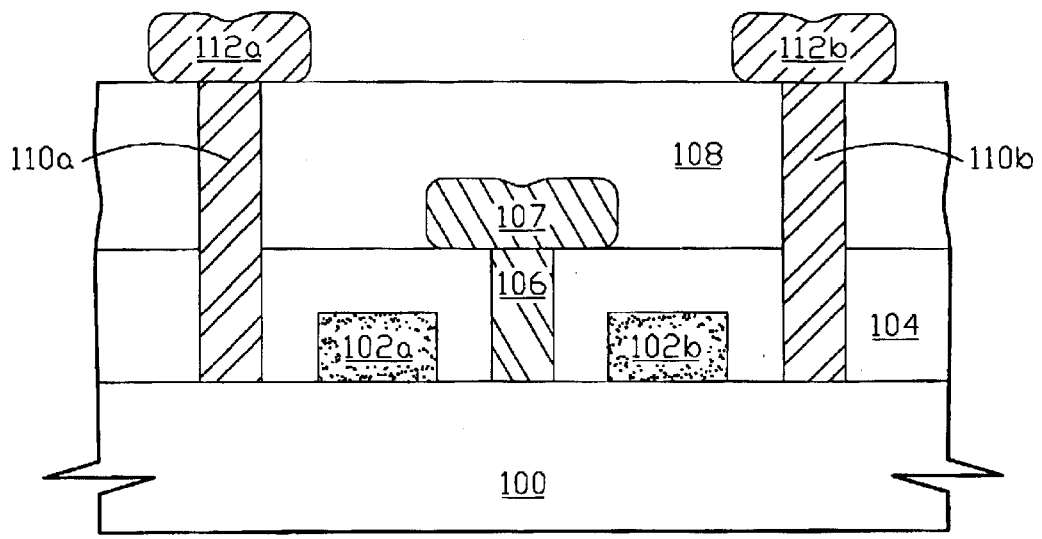
FIG. 1 shows a cross-sectional diagram of a conventional dynamic random access memory device.
Figure 4:
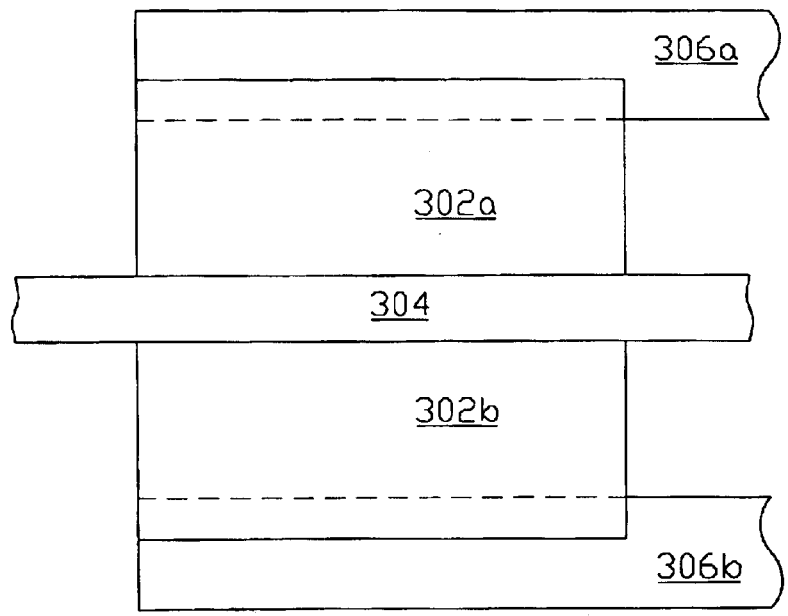
FIG. 4 shows a top view of a metal oxide semiconductor device.
Figure 5:
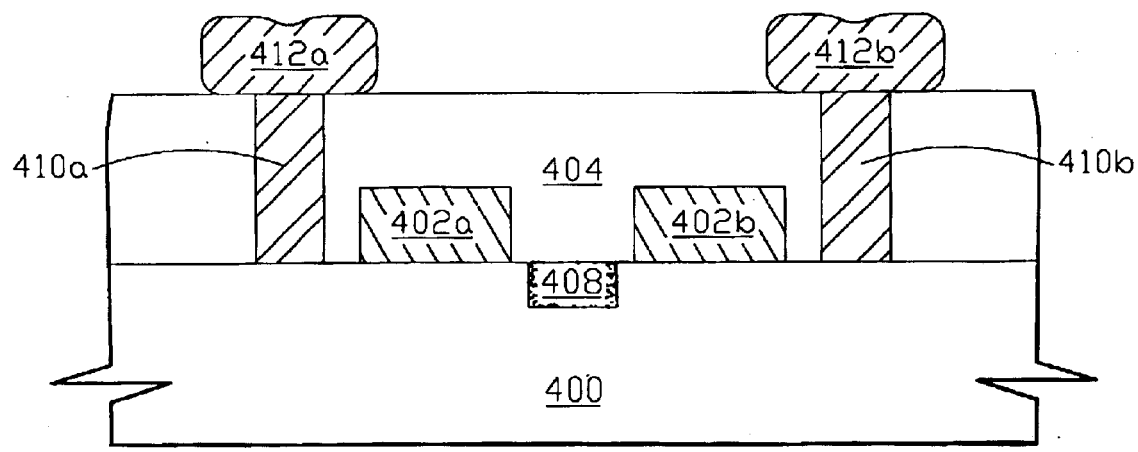
FIG. 5 shows a cross-sectional diagram of a dynamic random access memory device.

FIG. 4 shows a top view of a metal oxide semiconductor (MOS) device whose buried conductive lines 306a and 306b are formed by the method of this invention. The metal oxide semiconductor device comprises a word line 304, a source region 302a and a drain region 302b. The buried conductive lines 306a and 306b are used to replace the conventional contacts and conductive lines and are formed by the method set forth. FIG. 5 shows a cross-sectional diagram of a dynamic random access memory (DRAM) device whose buried conductive line 408 is formed by the method of this invention. A substrate 400, gate electrodes 402a and 402b, an interlevel dielectric layer 404, contacts 410a and 410b and conductive lines 412a and 412b are also shown in FIG. 5. Comparing the DRAM device shown in FIG. 5 to the conventional DRAM device shown in FIG. 1, the contact 106 and the bit line 107 are replaced with the buried conductive line 408 so that not only the dielectric layer 108 is no more needed, and the planarization of the DRAM device and the process window can be effectively increased. It is noted that the semiconductor devices mentioned above are just examples. The method of this invention can be applied to other semiconductor devices, e.g. volatile memories, non-volatile memories, and logic devices, to replace conventional contacts and lead lines with buried conductive lines of this invention.

The method uses an ion implantation with a tilt angle to form buried conductive lines under isolation regions such as shallow trench isolations or embedded in the substrate. The buried conductive lines connect neighboring active regions and replace conventional contacts of the active regions. Owing to the burying of the conductive lines, at least one interlevel dielectric layer and conventional contacts can be omitted thereby the process steps needed can be simplified. Moreover, not only the integration and the die density of semiconductor devices can be increased by the omitting of the conventional contacts as well as the decreasing of the overhead of the semiconductor devices, but also the planarization and the process window of semiconductor devices can be effectively upgraded.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method of manufacturing a semiconductor device with buried conductive lines, said method comprising:
   providing a substrate;
   forming trenches in said substrate and defining active regions;
   forming buried conductive lines into said substrate by an ion implantation process with a tilt angle;
   filling said trenches to form isolation regions; and
   forming active regions in said substrate connecting said buried conductive lines.

2. The method according to claim 1, wherein said ions comprise arsenic ions.

3. The method according to claim 1, wherein said ions comprise phosphorus ions.

4. The method according to claim 1, wherein said tilt angle is from about 7 degrees to about 45 degrees.

5. The method according to claim 4, wherein said tilt angle is preferably about 15 degrees.

6. The method according to claim 1, wherein the dosage of said ions is from about $1\times10^{15}$ $cm^{-2}$ to about $3\times10^{15}$ $cm^{-2}$.

7. The method according to claim 1, wherein the thickness of said conductive line is from about 1000 angstroms to about 2500 angstroms.

8. A method of manufacturing a semiconductor device with buried conductive lines, said method comprising:

provic a substrate;

forming trenches in said substrate and defining active regions;

forming buried conductive lines into said substrate by an ion implantation process with a tilt angle;

filling said trenches to form isolation regions;

forming source and drain regions in said substrate connecting said buried conductive lines respectively; and forming gate electrodes on said substrate and between adjacent said source and drain regions.

9. The method according to claim 8, wherein said ions comprise arsenic ions.

10. The method according to claim 8, wherein said ions comprise phosphorus ions.

11. The method according to claim 8, wherein said tilt angle is from about 7 degrees to about 45 degrees.

12. The method according to claim 11, wherein said tilt angle is preferably about 15 degrees.

13. The method according to claim 8, wherein the dosage of said ions is from about $1 \times 10^{15}$ cm$^{-2}$ to about $3 \times 10^{15}$ cm$^{-2}$.

14. The method according to claim 8, wherein the thickness of said conductive line is from about 1000 angstroms to about 2500 angstroms.

15. A method of manufacturing a semiconductor device with buried conductive lines, said method comprising:

providing a substrate;

forming trenches in said substrate and defining active regions;

forming buried conductive lines into said substrate as bit lines by an ion implantation process with a tilt angle from about 7 degrees to about 45 degrees;

filling said trenches to form trench isolation regions;

forming source and drain regions in said substrate connecting said buried conductive lines respectively; and forming word lines on said substrate and between adjacent said source and drain regions.

16. The method according to claim 15, wherein said ions comprise arsenic ions.

17. The method according to claim 15, wherein said ions comprise phosphorus ions.

18. The method according to claim 15, wherein said tilt angle is preferably about 15 degrees.

19. The method according to claim 15, wherein the dosage of said ions is from about $1 \times 10^{15}$ cm$^{-2}$ to about $3 \times 10^{15}$ cm$^{-2}$.

20. The method according to claim 15, wherein the thickness of said conductive line is from about 1000 angstroms to about 2500 angstroms.

* * * * *